(12) United States Patent
Oishi

(10) Patent No.: US 9,007,248 B2
(45) Date of Patent: Apr. 14, 2015

(54) MASH SIGMA-DELTA MODULATOR AND DA CONVERTER CIRCUIT

(71) Applicant: Fujitsu Limited, Kawasaki-shi, Kanagawa (JP)

(72) Inventor: Kazuaki Oishi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 23 days.

(21) Appl. No.: 14/028,905

(22) Filed: Sep. 17, 2013

(65) Prior Publication Data

US 2014/0015700 A1 Jan. 16, 2014

Related U.S. Application Data

(63) Continuation of application No. PCT/JP2011/056622, filed on Mar. 18, 2011.

(51) Int. Cl.
*H03M 3/00* (2006.01)
*H03M 7/30* (2006.01)

(52) U.S. Cl.
CPC .............. *H03M 3/50* (2013.01); *H03M 7/3022* (2013.01); *H03M 3/30* (2013.01)

(58) Field of Classification Search
CPC ..... H03M 7/3022; H03M 3/50; H03M 3/326; H03M 3/39; H03M 3/396; H03M 7/3008; H03M 7/302; H03M 7/3026; H03M 7/3042; H03M 9/00; H03M 3/30; H03M 3/356; H03M 3/414; H03M 3/438; H03M 7/3004
USPC .......... 341/143, 144, 155; 327/156, 157, 159; 375/374–376
See application file for complete search history.

(56) References Cited

U.S. PATENT DOCUMENTS 7,280,056 B2 * 10/2007 Puma .............................. 341/76
7,911,247 B2 * 3/2011 Xu et al. ........................ 327/156
8,203,475 B2 * 6/2012 Hossain et al. ............... 341/143
(Continued)

FOREIGN PATENT DOCUMENTS

JP 2002-520898 A 7/2002
JP 2004-260791 A 9/2004

OTHER PUBLICATIONS

International Search Report, PCT/JP2011/056622 dated Apr. 12, 2011.
(Continued)

*Primary Examiner* — Linh Nguyen
(74) *Attorney, Agent, or Firm* — Arent Fox LLP

(57) ABSTRACT

A MASH sigma-delta modulator includes: parallel integration units in M stages configured to receive N pieces of data from a previous stage, to perform integral calculation in parallel; parallel differentiation units each configured to calculate a difference between neighboring overflows of the corresponding parallel integration unit of the integration part; and a parallel-to-serial conversion part configured to parallel-to-serial convert outputs from the differentiation part, wherein the parallel integration units receive pieces of input data in parallel, the parallel integration unit in each stage and the parallel differentiation unit in each stage perform integral calculation and differential calculation in each stage in one operation clock of a frequency 1/N times a master clock frequency, and the parallel-to-serial conversion part outputs the result of the parallel-to-serial conversion in synchronization with the master clock.

18 Claims, 17 Drawing Sheets

(56) References Cited

U.S. PATENT DOCUMENTS

| | | | |
|---|---|---|---|
| 2003/0235261 A1* | 12/2003 | Patana | 375/376 |
| 2004/0164809 A1 | 8/2004 | Gibbs | |
| 2006/0139194 A1* | 6/2006 | Hasegawa | 341/143 |
| 2007/0205931 A1* | 9/2007 | Vanselow et al. | 341/143 |
| 2008/0042886 A1* | 2/2008 | Li Puma | 341/143 |
| 2009/0079605 A1* | 3/2009 | Chang | 341/143 |
| 2011/0170628 A1* | 7/2011 | Oishi et al. | 375/295 |

OTHER PUBLICATIONS

Mucahit Kozak et al., "Rigorous Analysis of Delta-Sigma Modulators for Fractional -N PLL Frequency Synthesis", IEE Transcations on Circuits and Systems -I: Regular Papers, Jun. 2004, pp. 1148-1162, vol. 51, No. 6.

* cited by examiner

FIG.15

| CODE CONVERSION | |
|---|---|
| BEFORE OUT[2:0] | AFTER OUT2[7:0] |
| 4 | 11111111 |
| 3 | 01111111 |
| 2 | 00111111 |
| 1 | 00011111 |
| 0 | 00001111 |
| −1 | 00000111 |
| −2 | 00000011 |
| −3 | 00000001 |

US 9,007,248 B2

MASH SIGMA-DELTA MODULATOR AND DA CONVERTER CIRCUIT

CROSS-REFERENCE TO RELATED APPLICATION

This application is a continuation application of International Application PCT/JP2011/056622 filed on Mar. 18, 2011 and designated the U.S., the entire contents of which are incorporated herein by reference.

FIELD

The disclosed techniques relate to a MASH sigma-delta modulator and a DAC (Digital-to-Analog Converter) including the same.

BACKGROUND

As high-resolution and fast ADC (Analog-to-Digital Converter) and DAC, one that uses a sigma-delta ($\Sigma\Delta$) modulator has come to be used widely. Sigma-delta conversion in the ADC and sigma-delta conversion in the DAC are in an inverse relationship and this is also true as to MASH (Multistage Noise Shaping), described later. The following DAC is explained as an example.

FIG. 1 is a diagram illustrating an outline of a configuration of a sigma-delta DAC that uses sigma-delta conversion.

As illustrated in FIG. 1, an interpolation filter 12 increases a clock frequency by interpolating input data with a large number of bits based on an OSR (Oversampling Ratio) 11. After that, a sigma-delta modulator ($\Sigma\Delta$Mod) 13 converts the data with a large number of bits into data with a small number of bits. After that, a DAC 14 for a small number of bits converts data with a small number of bits into an analog signal and the analog signal is output via an analog low-pass filter 15.

As widely known, the sigma-delta modulator 13 is a converter configured to convert low-speed data with a large number of bits into a high-speed data string with a small number of bits by having information not only in the amplitude direction but also in the time axis direction. Its output is one with a small number of bits, however, has information of high resolution.

FIG. 2A to FIG. 2C are diagrams for explaining the above by frequency regions.

As illustrated in FIG. 2A, data input to the sigma-delta DAC has a spectrum C that repeats in each sampling period of the input data. The spectra C located at the positions of $2\pi$, $4\pi$, ... are loop-back components by sampling, and therefore, un-usable components. As illustrated in FIG. 2B, the sigma-delta modulator 13 shifts the un-usable loop-back spectra C that are repeated to a spectrum D on the high-frequency side by increasing the sampling frequency. The spectrum D on the high-frequency side is cut by the analog low-pass filter 15 having passing characteristics indicated by E as illustrated in FIG. 2C. By shifting the un-usable loop-back spectra C to the spectrum D on the high-frequency side, the demand for the passing characteristics of the analog low-pass filter 15 is reduced, and thereby, the burden to the analog low-pass filter 15 is reduced. Due to this, it is possible to reduce the burden to an analog circuit the chip area of which tends to increase.

In order to further reduce the burden to an analog circuit, it is desirable to further increase the operating frequency of the sigma-delta modulator.

FIG. 3A and FIG. 3B are diagrams for explaining the effect obtained by shifting repeated spectra toward high frequencies.

As illustrated in FIG. 3A, when the operating frequency of the sigma-delta modulator 13 is low, the loop-back component D by sampling is close to the effective spectrum range in the vicinity of a direct current (DC), and therefore, the high-order analog low-pass filter 15 exhibiting the steep passing characteristics E is desired. In contrast to this, when the operating frequency is high, as illustrated in FIG. 3B, a loop-back component D' becomes more distant from the DC, and therefore, it is possible to utilize a low-order low-pass filter with less steep characteristics E. Due to this, the burden to the analog circuit is reduced and the chip area can be reduced.

However, there is a limit to the operating speed of the $\Sigma\Delta$ modulator configured by a digital circuit and it is not possible to sufficiently increase the operating frequency.

Non-Patent Document 1 (Mucahit Kizak, et al.) has proposed a MASH (Multistage Noise Shaping) sigma-delta modulator that differentiates an overflow of an adder of an integration unit to obtain its output.

FIG. 4 is a diagram illustrating the configuration of the MASH sigma-delta modulator described in Non-Patent Document 1. The sigma-delta modulator illustrated in FIG. 4 is a three-stage MASH sigma-delta modulator.

As illustrated schematically, the sigma-delta modulator has an integration part S and a differentiation part T. The integration part S has integration units connected in series in the number corresponding to the number of stages of the sigma-delta modulator (three stages in FIG. 4). The integration unit in each stage has each of adders AD0 to AD2 and each of flip-flops ($Z^{-1}$) SF0 to SF2. Each integration unit performs integration by calculating the sum of the input data and the calculation result one clock before. The overflows of the integration units (the adders AD0 to AD2) are input to the differentiation part T.

The differentiation part T has two differentiation units, two adders TA0 and TA1, and flip-flops MF01, MF02, and MF1. One of the differentiation units has a flip-flop ($Z^{-1}$) TF1 configured to hold the overflow of the adder AD2 in the third stage of the integration part S in accordance with a clock, and a subtracter TS1 configured to subtract the output of TF1 from the overflow of AD2. MF01 delays the overflow of AD1 in the second stage of the integration part S by an amount corresponding to one clock. TA1 is the adder of the outputs of TS1 and MF1. The other differentiation unit has TF0 configured to hold the output of TA1 and TS0 configured to subtract the output of TF0 from the output of TA1. MF01 and MF02 each delay the overflow of AD0 in the first stage of the integration part S by an amount corresponding to one clock each time in two stages. TA0 is the adder of the outputs of TS0 and MF02. The differentiation unit in each stage performs differentiation by calculating a difference between the data one clock before and the current data.

FIG. 5 illustrates an output waveform when generating an analog output at a fixed DC level in the three-stage MASH sigma-delta modulator in FIG. 4. The operation of the sigma-delta modulator is explained with reference to FIG. 5.

The instantaneous value of the output data is data with a small number of bits in eight levels from −4 to 3. The output data changes at a high speed and its average value can represent high resolution equal to or less than the decimal point. In other words, although the value is a discrete value with a small number of bits instantaneously, the value becomes a value of high resolution in a long period (average). In the frequency region, this is a spectrum in which noise components exist on the high-frequency side in addition to signal components.

These noise components are referred to a quantized noise and occur due to an instantaneous high-speed change.

The MASH sigma-delta modulator is widely known, and therefore, more explanation is omitted.

As describe previously, in order to make the quantized noise more distant from the effective spectrum range in the vicinity of the DC, it is desirable to operate the sigma-delta modulator at a high speed, however, in order to do so, it is desirable to operate the integration part S and the differential part T at a high speed. However, the amount of calculation at the integration part S and the differential part T is very large, and therefore, there is a limit to the high-speed operation.

RELATED DOCUMENTS

[Patent Document 1] Japanese Laid Open Patent Document No. 2002-520898
[Non Patent Document 1] Mucahit Kizak, Izzet Kale "Rigorous Analysis of Delta-Sigma Modulators for Fractional-N PLL Frequency Synthesis" IEEE TRANSACTIONS ON CIRCUITS AND SYSTEMS-I: REGULAR PAPERS, VOL. 51, NO. 6, June 2004

SUMMARY

According to an aspect of the embodiments, a MASH sigma-delta modulator includes: an integration part having parallel integration units in M (M; an integer not less than 1) stages configured to receive N (N; an integer not less than 2) pieces of data from a previous stage, to perform integral calculation in parallel, and to output a result to a subsequent stage; a differentiation part having parallel differentiation units each configured to calculate a difference between neighboring overflows of the corresponding parallel integration unit of the integration part and also to receive the difference, to perform differential calculation in parallel, and to output a result to a subsequent stage; and a parallel-to-serial conversion part configured to parallel-to-serial convert outputs from the differentiation part, wherein the parallel integration units in the initial stage of the integration part receive pieces of input data in parallel, the parallel integration unit in each stage of the integration part and the parallel differentiation unit in each stage of the differentiation part perform integral calculation and differential calculation in each stage in one operation clock of a frequency 1/N times a master clock frequency, and the parallel-to-serial conversion part outputs the result of the parallel-to-serial conversion in synchronization with the master clock.

According to another aspect of the embodiments, a D/A converter includes: an interpolation filter configured to generate oversampling data; a sigma-delta modulator configured to convert the oversampling data with a large number of bits into converted data with a small number of bits; a D/A converter for a small number of bits configured to convert the converted data with a small number of bits into an analog signal; and an analog low-pass filter configured to allow low-frequency components of the output of the D/A converter with a small number of bits to pass, wherein the sigma-delta modulator is a MASH sigma-delta modulator including: an integration part having parallel integration units in M (M; an integer not less than 1) stages configured to receive N (N; an integer not less than 2) pieces of data from a previous stage, to perform integral calculation in parallel, and to output a result to a subsequent stage; a differentiation part having parallel differentiation units each configured to calculate a difference between neighboring overflows of the corresponding parallel integration unit of the integration part and also to receive the difference, to perform differential calculation in parallel, and to output a result to a subsequent stage; and a parallel-to-serial conversion part configured to parallel-to-serial convert outputs from the differentiation part, wherein the parallel integration units in the initial stage of the integration part receive pieces of input data in parallel, the parallel integration unit in each stage of the integration part and the parallel differentiation unit in each stage of the differentiation part perform integral calculation and differential calculation in each stage in one operation clock of a frequency 1/N times a master clock frequency, and the parallel-to-serial conversion part outputs the result of the parallel-to-serial conversion in synchronization with the master clock.

The object and advantages of the embodiments will be realized and attained by means of the elements and combination particularly pointed out in the claims.

It is to be understood that both the foregoing general description and the following detailed description are exemplary and explanatory and are not restrictive of the invention.

BRIEF DESCRIPTION OF THE DRAWINGS

FIG. 15 is a table indicating an example of conversion code;

DESCRIPTION OF EMBODIMENTS

The following embodiments realize a MASH sigma-delta modulator which has substantially increased the speed of the operation clock by performing calculations at the integration part and the differentiation part in parallel.

Figure 6:
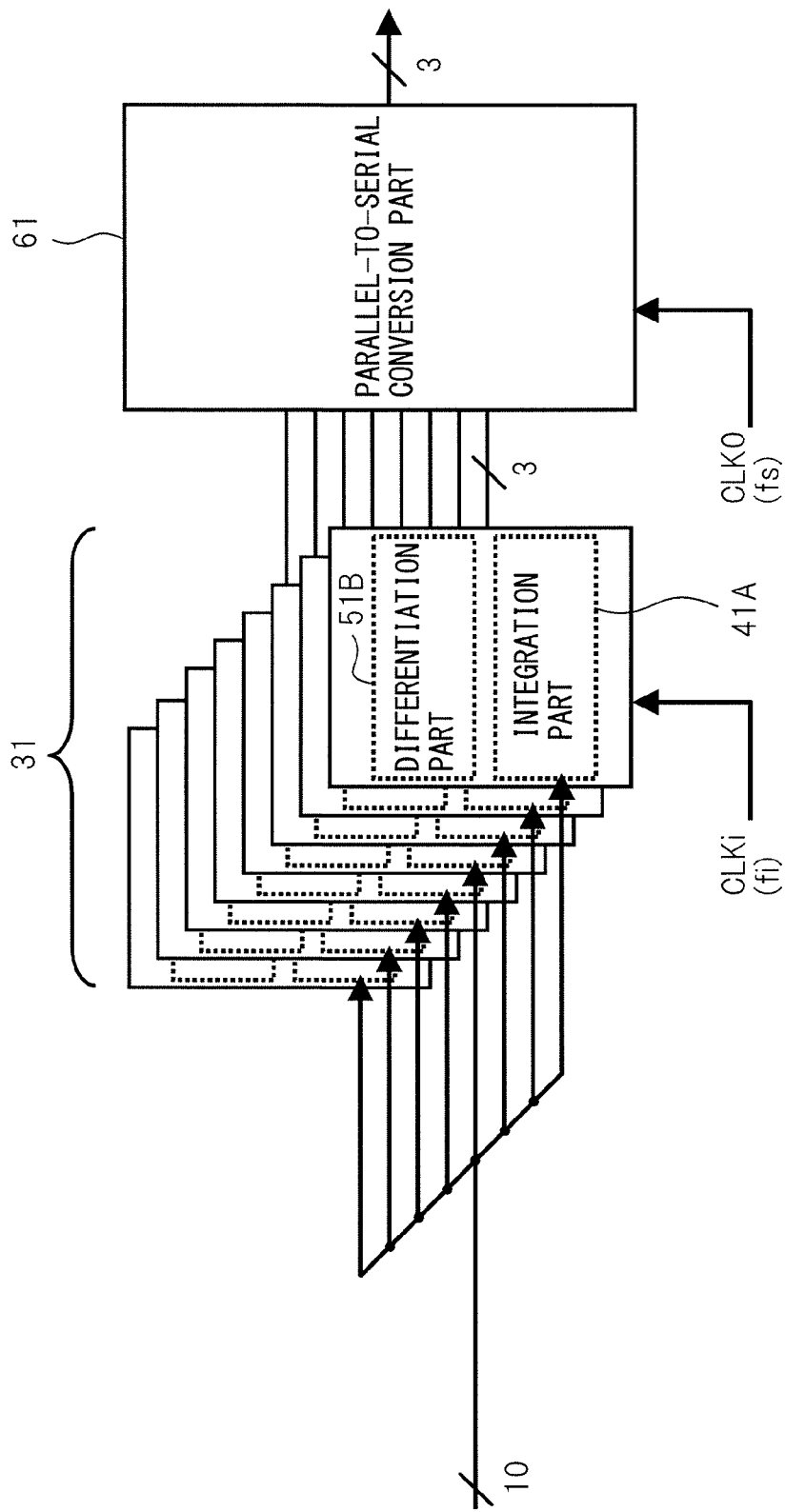
FIG. 6 is a simplified conceptual diagram for explaining the operation of the sigma-delta modulator of the first embodiment.

FIG. 6 is a diagram illustrating a constitution of a sigma-delta modulator of a first embodiment. The detailed constitution of the sigma-delta modulator of the first embodiment will be illustrated later with reference to FIGS. 7, 8, 9, 10A, 10B and 11.

Figure 1:
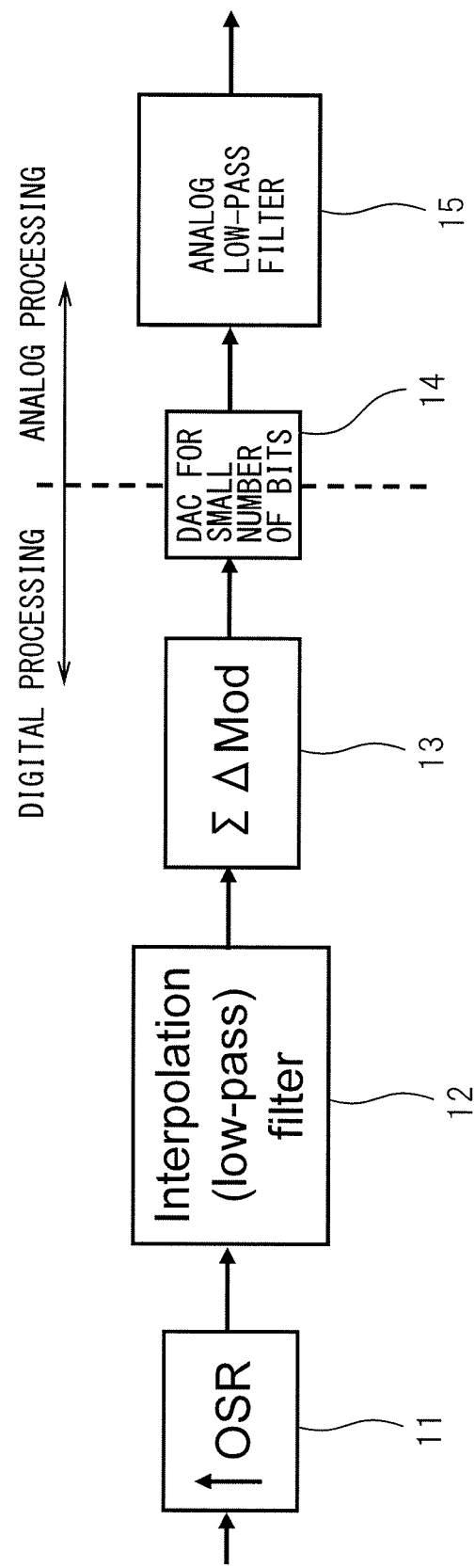
FIG. 1 is a diagram illustrating an outline of a configuration of a sigma-delta DAC that uses sigma-delta conversion.
Figure 2A:
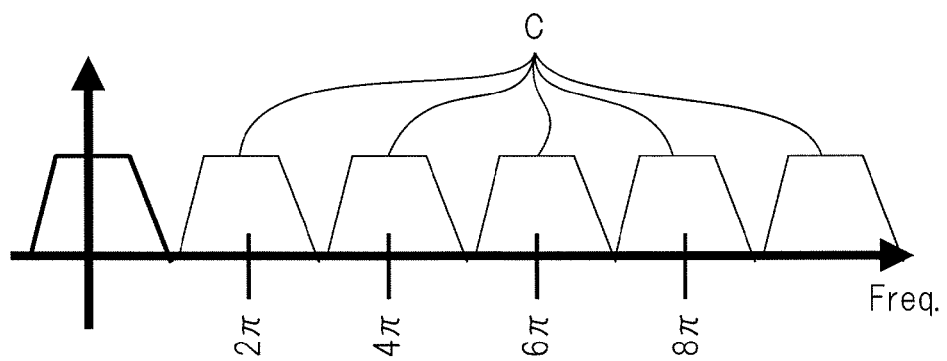
FIG. 2A to FIG. 2C are diagrams for explaining the above by frequency regions.
Figure 2B:
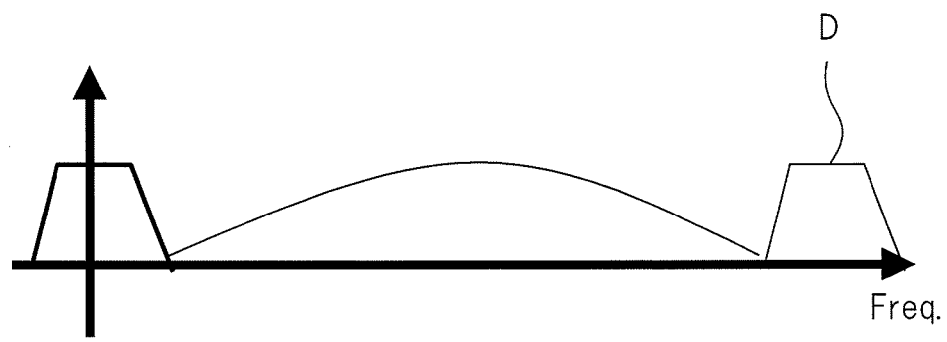
Figure 2C:
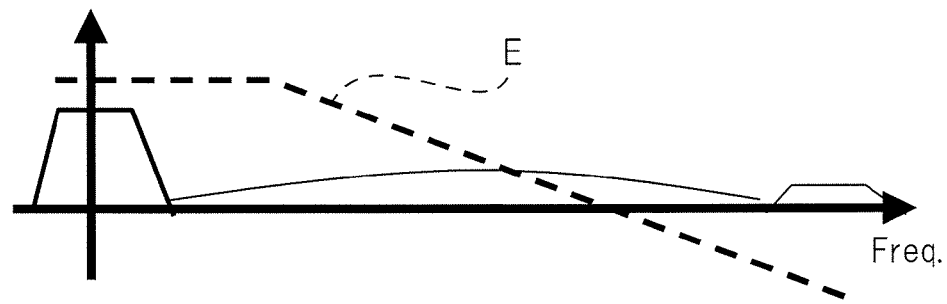
Figure 3A:
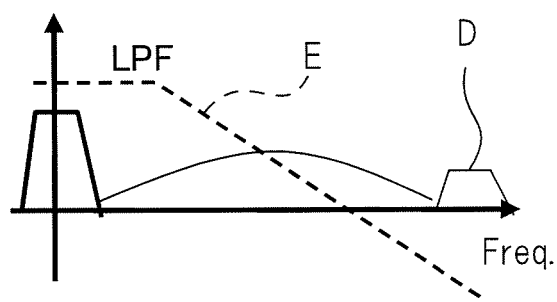
FIG. 3A and FIG. 3B are diagrams for explaining the effect obtained by shifting repeated spectra toward high frequencies.
Figure 3B:
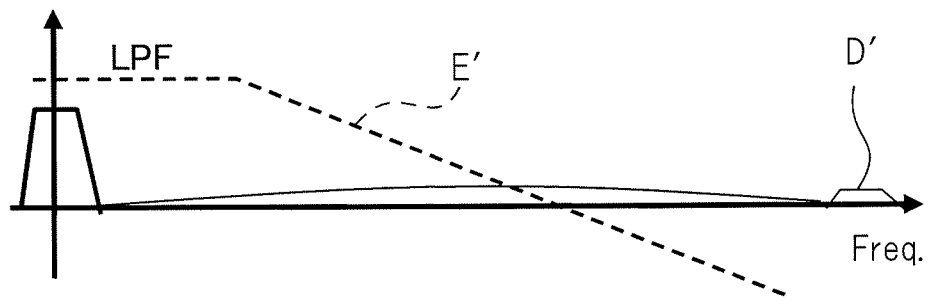

The sigma-delta modulator of the first embodiment is the three-stage MASH sigma-delta modulator and used in the sigma-delta modulator (ΣΔMod) 13 illustrated in FIG. 1, etc. The sigma-delta modulator of the first embodiment generates j-bit output data from i-bit input data. In the following explanation, a case is explained where it is assumed that i=10 and j=3 and processing to calculate eight pieces of input data in parallel is performed in sigma-delta calculation, however, the sigma-delta modulator is not limited to this.

As illustrated in FIG. 6, the sigma-delta modulator of the first embodiment has a sigma-delta calculation part 31 and a parallel-to-serial conversion part 61.

The input is input to the sigma-delta calculation unit 31 as 8-parallel input data. The input data is synchronized with an operation clock CLK i having a frequency fi (=Fs/8) (period eight times that of master clock).

The sigma-delta calculation unit 31 has eight sets of an integration part 41A and a differentiation part 51A and performs integration calculation and differentiation calculation in parallel of the eight pieces of input data. As will be described later, the eight sets of the integration part 41A and the differentiation part 51A are formed into one unit, respectively, and calculation is performed. The integration part and the differentiation part formed into one unit include calculation units in a plurality of stages, and perform the calculation in each stage in synchronization with the operation clock CLKi and outputs eight pieces of 3-bit output data in parallel in synchronization with CLKi.

The parallel-to-serial conversion unit 61 converts the eight pieces of 3-bit output data output in parallel in synchronization with CLKi into serial 3-bit output data and outputs it in synchronization with CLK0.

Figure 7:
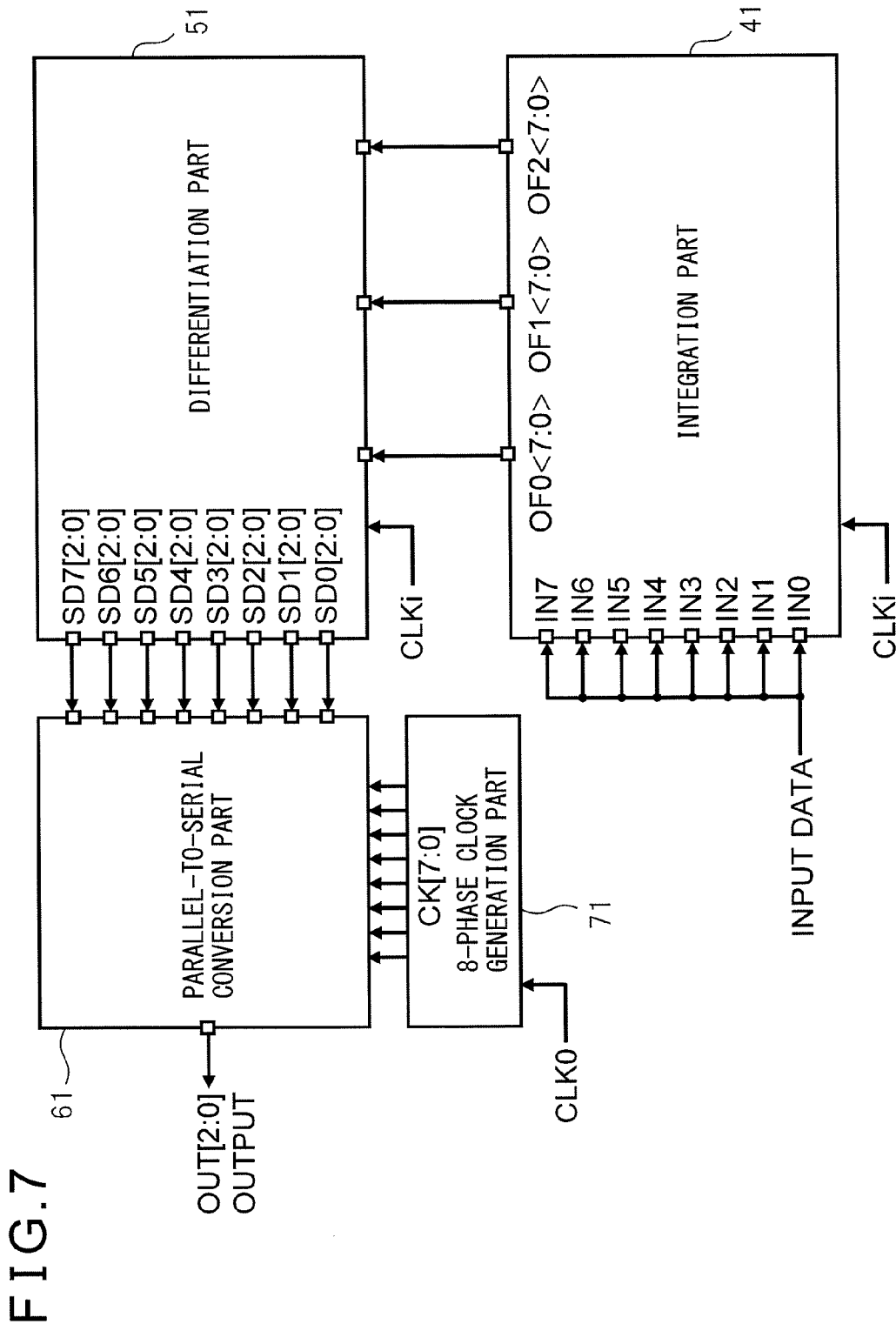
FIG. 7 is a diagram illustrating a general configuration of the sigma-delta modulator of the first embodiment.

FIG. 7 is a diagram illustrating a general configuration of the sigma-delta modulator of the first embodiment.

As illustrated in FIG. 7, the sigma-delta modulator of the first embodiment has an integration part 41, a differentiation part 51, the parallel-to-serial conversion part 61, and an 8-phase clock generation part 71. The 8-phase clock generation unit 71 supplies a clock to the parallel-to-serial conversion part 61. As described above, the frequency fi of the operation clock CLKi is ⅛ of the frequency fs of the master clock. The integration part 41 and the differentiation part 51 operate in synchronization with the operation clock CLKi. The 8-phase clock generation part 71 generates an 8-phase clock from the master clock CLK0, which has a pulse width corresponding to the period of CLK0 and a period eight times the period of CLK0, and which shifts by an amount corresponding to the period of CLK0 each time, and outputs the 8-phase clock to the parallel-to-serial conversion part 61. The parallel-to-serial conversion part 61 operates based on the 8-phase clock, and therefore, operates substantially in synchronization with CLK0.

As illustrated in FIG. 7, the integration part 41 receives eight pieces of 10-bit input data in parallel, and performs integral calculation and outputs in parallel three sets of integral data OF0 to OF2 including the 8-parallel calculation result to the differentiation part 51 in synchronization with CLKi. The differentiation part 51 receives the integral data OF0 to OF2, and performs differential calculation and outputs in parallel 7-parallel differential data SD0 to SD7 including the 3-bit calculation result to the parallel-to-serial conversion unit 61 in synchronization with CLKi. The parallel-to-serial conversion unit 61 receives the differential data SD0 to SD7 in parallel, converts it into serial output data OUT, and outputs it in synchronization with CLK0.

In the sigma-delta modulator of the first embodiment, the integration part 41 and the differentiation part 51 perform the processing of integral calculation and differential calculation the amount of calculation of which is large on eight pieces of data in parallel, and thereby, it is possible to perform processing at a high speed even if the operating frequency is reduced. The parallel data of the calculation result obtained by the parallel processing is converted into serial data by the parallel-to-serial conversion unit 61 capable of high-speed operation and output as high-speed data. Due to this, it is possible to realize a sigma-delta modulator capable of high-speed operation.

Next, the internal configuration of each part and unit is explained.

Figure 8:
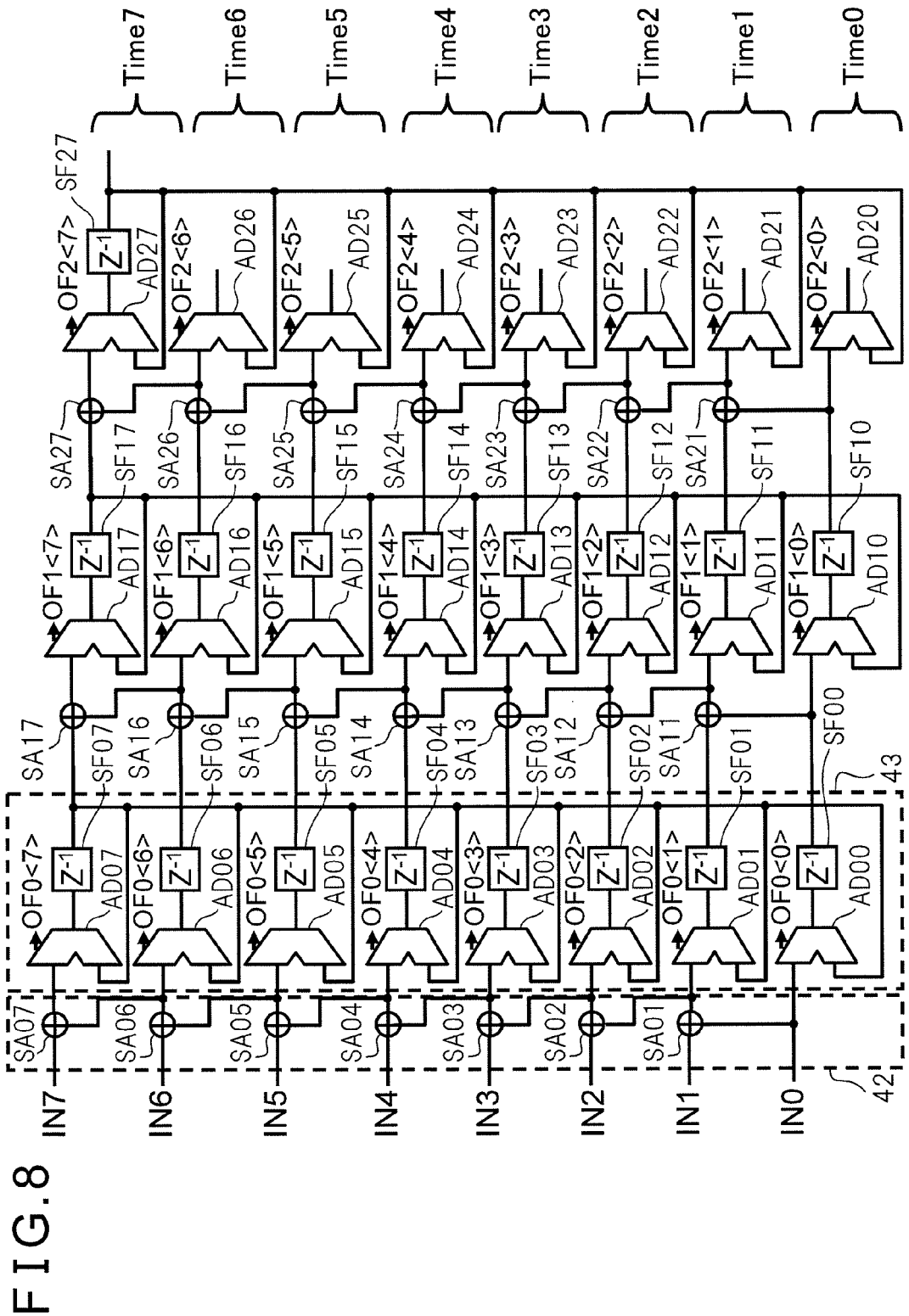
FIG. 8 is a diagram illustrating a configuration example of the integration part.

FIG. 8 is a diagram illustrating a configuration example of the integration part 41. As described above, the integration part 41 has an 8-parallel three-order (three-stage) configuration and receives input data IN0 to IN7 in parallel.

Each stage of the integration part 41 has a parallel integration unit. The parallel integration unit in each stage has an input data addition part and a parallel integration part. In FIG. 8, reference numeral 42 denotes the input data addition part in the first stage and reference numeral 43 denotes the parallel integration part in the first stage, respectively. As illustrated in FIG. 8, in the second and the third stage also, the parallel integration unit having the input data addition part and the parallel integration part is provided similarly.

The input data addition part 42 in the first stage includes a row of seven input data adders SA01 to SA07. SA01 adds IN0 and IN1 and outputs an added value. SA02 adds the output of SA01 and IN2 and outputs an added value. Similarly in this manner, the Xth SA0X adds the output of SA0(X−1) in the previous stage and INX and outputs an added value. The configuration may be one in which calculations equivalent to the above are performed.

Consequently, the output of SA07=IN0+IN1+IN2+IN3+IN4+IN5+IN6+IN7.

The parallel integration part 43 in the first stage includes a row of eight sets of parallel integrators including input adders AD00 to AD07 and flip-flops SF00 to SF07. The set of one input adder and one flip-flop forms the integrator. AD00 adds the input data IN0 and the output of SF07. SF00 holds the output of AD10 and outputs it in synchronization with CLKi. The overflow output of AD00 is output as OF0 <0>. AD01 adds the output of SA01 and the output of SF07. SF01 holds the output of AD01 and outputs it in synchronization with CLKi. The overflow output of AD01 is output as OF0 <1>. Similarly in this manner, the Xth AD0X adds the output of the corresponding SA0X and the output of SF07, and SF0x holds the output of AD0X and outputs it in synchronization with CLKi. The overflow output of AD0X is output as OF0 <X>. Consequently, the integration unit including AD00 and SF00 calculates and outputs an integrated value, which the integrated value of the input data one clock before output from SF07 to which the input data IN0 input newly is added. The integration unit including AD01 and SF01 calculates and outputs an integrated value, which is the integrated value of the input data one clock before output from SF07 to which the input data IN0 and IN1 input newly are added. Similarly in this manner, the integration unit including AD07 and SF07 calculates and outputs an integrated value, which is the integrated value of the input data one clock before output from SF07 to which the input data IN0 to IN7 input newly is added. The overflow outputs of the adders AD00 to AD07 are OF0 <0> to OF0 <7>.

If OF0 <7> one clock before is taken to be OF0' <7>, in AD00, the data whose number of bits is within the number of bits of the input data (IN0) is input to SF00 as AD00 output=IN0+OF0' <7> and the data whose number of bits exceeds the number of bits of the input data (IN0) is output as OF0 <0>. Similarly, in AD01, AD01 output=IN0+IN1+OF0' <0> and OF0 <1> are output. Similarly in this manner, in AD07, AD07 output=IN0+IN1+IN2+IN3+IN4+IN5+IN6+ IN7+OF0' <7> and OF0' <7> are output and in one period of CLKi, integration (addition) corresponding to 8-time integration (addition) is performed eight times at the same time.

OF0 <1> is the cumulative overflow value when integration is performed twice on two pieces of data IN0 and IN1 and similarly, OF0 <7> is the cumulative overflow when integration is performed eight times on eight pieces of data IN0 to IN7.

The input data adder in the second stage also includes a row of seven input data adders SA11 to SA17 and the parallel integration part in the second stage also includes a row of eight sets of parallel integrators including input adders AD10 to AD17 and flip-flops SF10 to SF17.

SA11 adds the outputs of SF00 and SF01 and outputs an added value. SA12 adds the output of SA11 and the output of SF02 and outputs an added value. Similarly in this manner, the Xth SA1X adds the output of SA1(X−1) and the output of SF0X in the first stage and outputs an added value.

AD10 adds the output of SF00 and the output of SF17. SF10 holds the output of AD10 and outputs it in synchronization with CLKi. The overflow of AD10 is output as OF1 <0>. AD11 adds the output of SA11 and the output of SF17. SF11 holds the output of AD11 and outputs it in synchronization with CLKi. The overflow of AD11 is output as OF1 <1>. Similarly in this manner, the Xth AD1X adds the output of SF00 or the corresponding SA1X, and SF1 holds the output of AD1X and outputs it in synchronization with CLKi. The overflow output of AD1X is output as OF1 <X>. Consequently, the integrator including AD10 and SF10 calculates and outputs an integrated value, which is the integrated value of the input data one clock before output from SF17 to which the output of SF00 input newly from the first stage is added. Similarly in this manner, the integration unit including AD17 and SF17 calculates and outputs an integrated value, which is the integrated value of the input data one clock before output from SF17 to which the outputs of SF00 to SF07 in the first stage are added. In this manner, the eight integration units perform integration calculations. The overflow outputs of the input adders AD10 to AD17 are OF1 <0> to OF1 <7>. As in the first stage, the parallel integration unit in the second stage also perform 8-parallel integration.

The input data addition part in the third stage also includes a row of seven input data adders SA21 to SA27. The parallel integration part in the third stage includes eight input adders AD20 to AD27, however, includes only one flip-flop SF27 corresponding to the eighth AD27 and flip-flops corresponding to AD20 to AD26 are not provided. Consequently, in the parallel integration part in the third stage, the integrator configured to add the output of SA27 is provided, however, other integrators are not provided. The reason is that the sigma-delta modulator of the first embodiment has three stages and the fourth stage does not exist, and therefore, it is not desirable to use the outputs of AD20 to AD26 in the next stage.

SA21 adds the outputs of SF10 and SF11 and outputs an added value. SA22 adds the output of SA21 and the output of SF12 and outputs an added value. Similarly in this manner, the Xth SA2X adds the output of SA2(X−1) and the output of SF1X and outputs an added value.

AD20 adds the output of SF10 and the output of SF27. The overflow of AD20 is output as OF2 <0>. AD21 adds the output of SA21 and the output of SF27. The overflow of AD21 is output as OF2 <1>. Similarly in this manner, the Xth AD2X adds the output of SF10 or the corresponding SA2X and the output of SF27, and the overflow output of AD2X is output as OF2 <X>. AD27 adds the output of SA27 and the output of SF27, and SF27 holds the output of AD27 and outputs it in synchronization with CLKi. The overflow of AD27 is output as OF2 <7>. The parallel integration unit in the third stage also perform 8-parallel integration or addition as in the first and the second stage.

As described above, the eight parallel integrators in each stage perform calculation of data corresponding to the eight master clocks in parallel with the operation clock CLKi and outputs three sets of 8-parallel data OF0 <0 to 7>, OF1 <0 to 7>, and OF2 <0 to 7>. In other words, in the integration part 41 of the first embodiment, the integration calculation result for the input data (overflow) is transferred to the differentiation part 51 as the output of the integration part 41.

Figure 9:
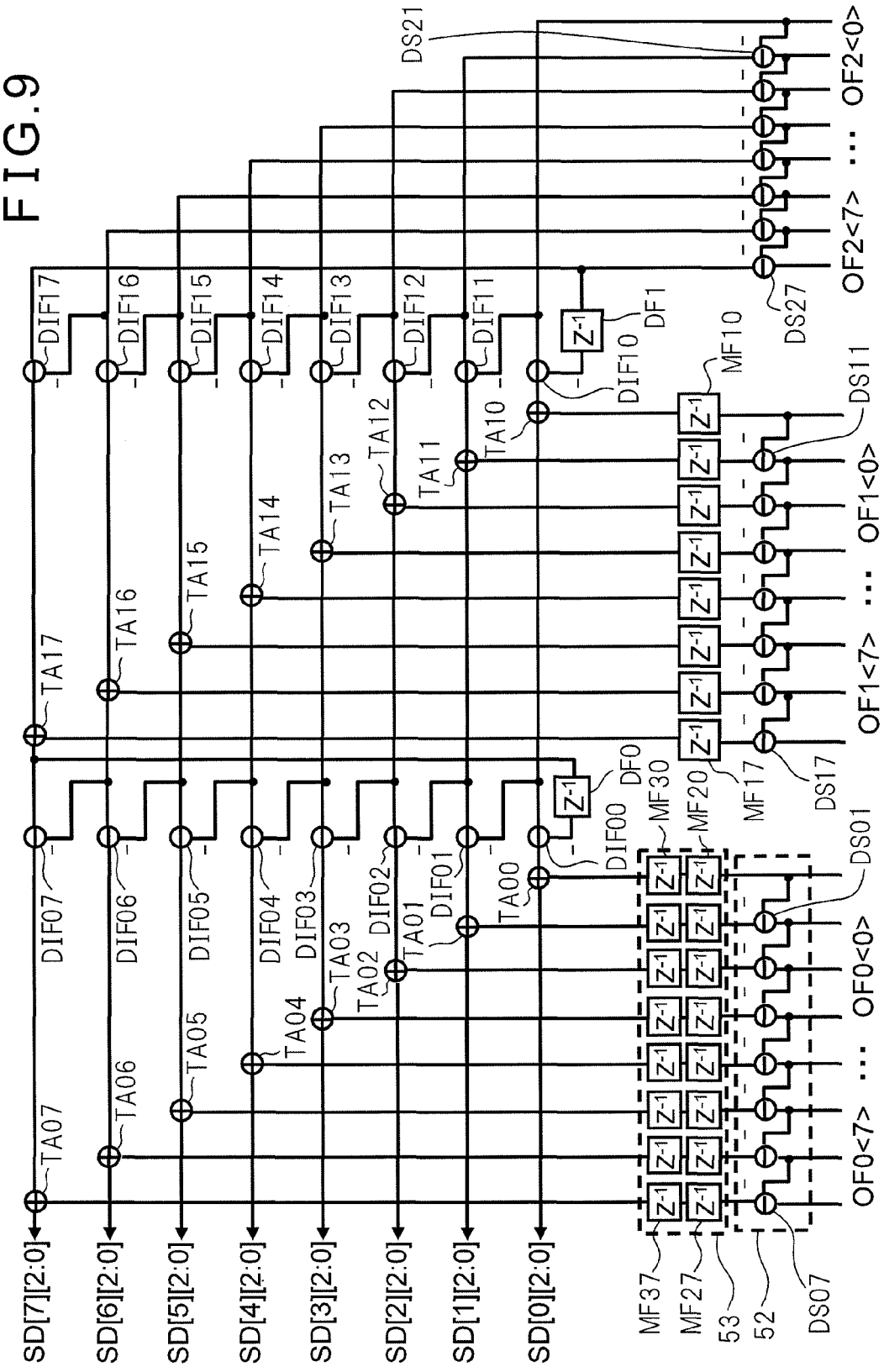
FIG. 9 is a diagram illustrating a configuration example of the differentiation part.

FIG. 9 is a diagram illustrating a configuration example of the differentiation part 51.

The differentiation part 51 has three parallel differentiation units corresponding to the parallel integration units in the first to third stages.

The parallel differentiation unit corresponding to the parallel integration unit in the third stage has a parallel differentiator including seven input subtractors DS21 to DS27, a flip-flop DF1, and eight subtracters DIF10 to DIF17.

The seven input subtractors DS21 to DS27 calculate differences between neighboring data of OF2 <0 to 7>, which are the overflows of the eight data adders AD20 to AD27 in the third stage of the integration part 41, and output OFD2 <1 to 7>. Consequently, OFD 2 <1>=OF2 <1>−OF2 <0>, ..., OFD 1 <7>=OF2 <7>−OF2 <6> hold. Further, it is assumed that OFD 2<0>=OF 2<0> holds. The flip-flop DF1 holds the output of DS27 and outputs it in synchronization with CLKi. As described previously, OF2 <1> takes the cumulative overflow value when performing integration twice on the two pieces of data of SF10 and SF11 and similarly, OF2 <x> is the cumulative overflow when performing integration (x+1) times on the (x+1) pieces of data of SF10 to SF1x, and therefore, calculation of the overflow from the cumulative overflow by one-time integration is performed by performing difference calculation. OFD2 <0> to OFD2 <7> will be 8-parallel overflow values output in the period (corresponding to the eight periods of the master clock) of CLKi.

The subtracter DIF10 subtracts the output of DF1 from OF2 <0> output from the data adder AD20 in the third stage of the integration part 41, i.e., from OFD2 <0> and outputs as DIF1 <0>. The second subtracter DIF11 subtracts OFD2 <0> from the output OFD2 <1> of DS21 and outputs as DIF1 <1>. Similarly in this manner, the Xth subtracter DIF1X subtracts OFD2 <X−1> from the output OFD2 <X> of DS2X and outputs DIF1 <X>. Consequently, DIF1 <0>=OFD2 <0>−DF1, DIF1 <1>=OFD2 <1>−OFD2 <0>, ..., DIF1 <7>=OFD2 <7>−OFD2 <6> hold and thus the differences between neighboring overflow signals are calculated, and therefore, the differential operation is performed.

The parallel differentiation unit in the second stage has seven input subtractors DS11 to DS17, a delay part, a row of eight adders TA10 to TA17, a flip-flop DF0, and eight subtracters DIF00 to DIF07.

The seven input subtractors DS11 to DS17 calculates differences between neighboring data of OF1 <0 to 7>, which are the overflows of the eight data adders AD10 to AD17 in the second stage of the integration part 41, and output OFD1 <1 to 7>. Consequently, OFD1 <1>=OF1 <1>−OF1 <0>, . . . , OFDI <7>=OF1 <7>−OF1 <6> hold. Further, it is assumed that OFD1 <0>=OF1 <0> holds. Because OF1 <x> is the cumulative overflow when performing integration (x+1) times on the (x+1) pieces of data of SF00 to SF0x, by performing the difference calculation, the calculation of the overflow from the cumulative overflow by one-time integration is performed. OFD1 <0> to OFD1 <7> are the 8-parallel overflow values output in the period (corresponding to the eight periods of the master clock) of CLKi.

The delay part has eight flip-flops MF10 to MF17, holds OFD1 <0 to 7>, and outputs them in synchronization with CLKi. In other words, the delay part delays OFD1 <0 to 7> by an amount corresponding to one period of CLKi.

TA10 to TA17 add the outputs of DIF10 to DIF17 and the outputs of MF10 to MF17, respectively, and output ADS1 <0 to 7>.

The flip-flop DF0 holds the output ADS1 <7> of TA17 and outputs it in synchronization with CLKi.

The subtracter DIF00 subtracts the output of DF0 from the output ADS1 <7> of TA10 and outputs as DIF0 <0>. The second subtracter DIF01 subtracts the output ADS1 <0> of TA10 from the output ADS1 <1> of TA11 and outputs as DIF0 <1>. Similarly in this manner, the Xth subtracter DIF0X subtracts the output ADS1 <X−1> of TA1X−1 from the output ADS1 <X> of TA1X and outputs as DIF <X>. Consequently, DIF00 to DIF07 and DF0 perform processing to differentiate the outputs of TA10 to TA17 and output differentiated values DIF0 <0 to 7>. Consequently, DIF0 <0>=ADS1 <0>−DF0, DIF0 <1>=ADS1 <1>−ADS1 <0>, . . . , DIF0 <7>=ADS1 <7>−ADS1 <6> hold and the differences between neighboring overflow signals are calculated, and therefore, the differential operation is performed.

The parallel differentiation unit in the first stage has seven input subtractors DS01 to DS07, a delay part, and eight adders TA00 to TA07.

The seven input subtractors DS01 to DS07 calculate differences between neighboring data of OF0 <0 to 7>, which are overflows of the eight adders AD00 to AD07 in the first stage of the integration part 41 and output OFD0 <1 to 7>. Consequently, OFD0 <1>=OF0 <1>−OF0 <0>, . . . , OFD0 <7>=OF0 <7>−OF0 <6> hold. Further, it is assumed that OFD0 <0>=OF0 <0> holds. OF0 <x> is the cumulative overflow when performing integration (x+1) times on the (x+1) pieces of data of IN0 to INx, and therefore, by performing this difference calculation, the calculation of overflow from the cumulative overflow by one-time integration is performed. OFD0 <0> to OFD0 <7> are 8-parallel overflow values output in the period (corresponding to the eight periods of the master clock) of CLKi.

The delay part has a first set including eight flip-flops MF20 to MF27 and a second set including eight flip-flops MF30 to MF37 and delays OFD0 <0 to 7> by an amount corresponding to two periods of CLKi.

TA00 to TA07 add the outputs of DIF00 to DIF07 and the outputs of MF30 to MF37, respectively, and output SD [0 to 7]. SD [0] to SD [7] are 3-bit data, respectively.

Figure 4:
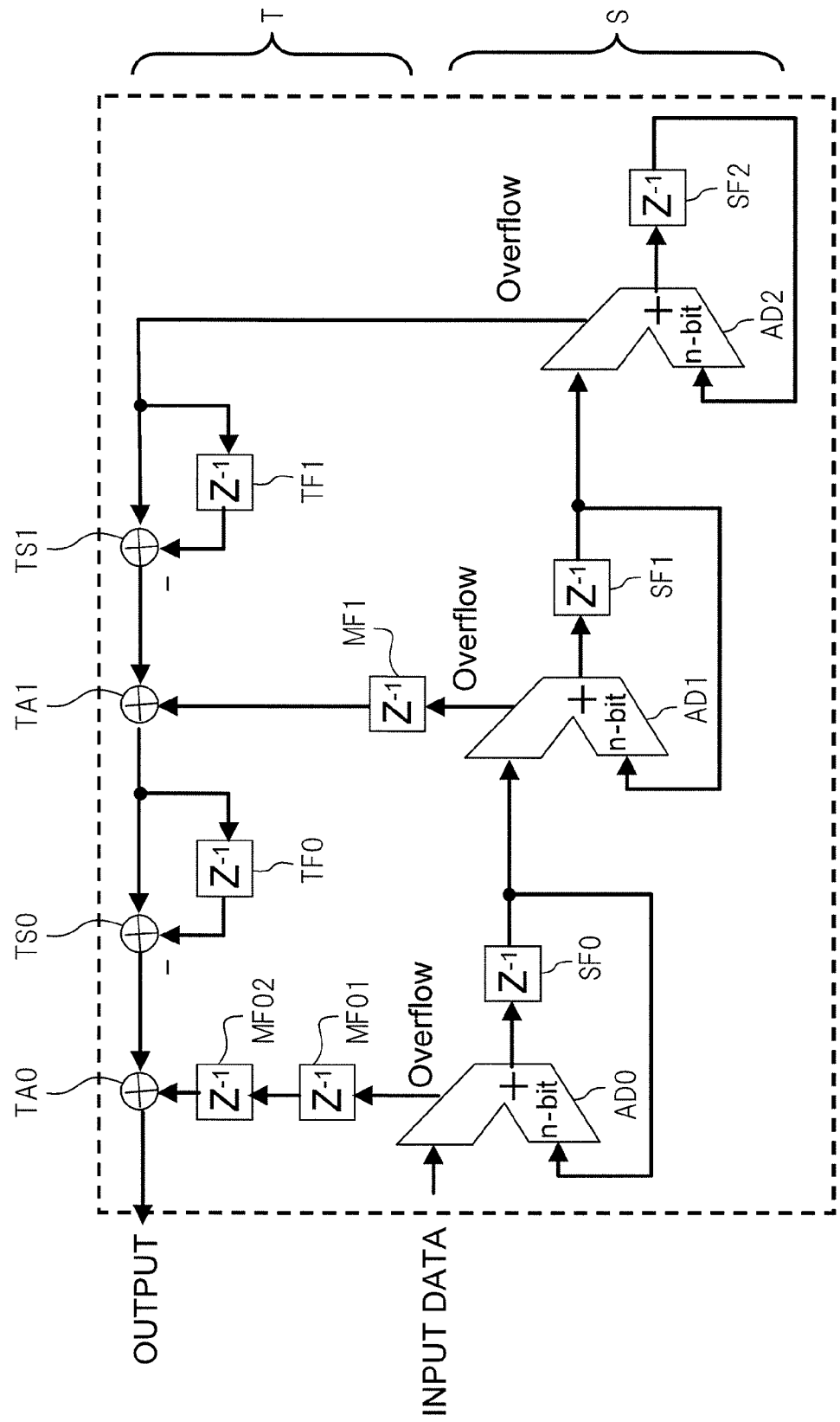
FIG. 4 is a diagram illustrating the configuration of the MASH sigma-delta modulator described in Non-Patent Document 1.
Figure 5:
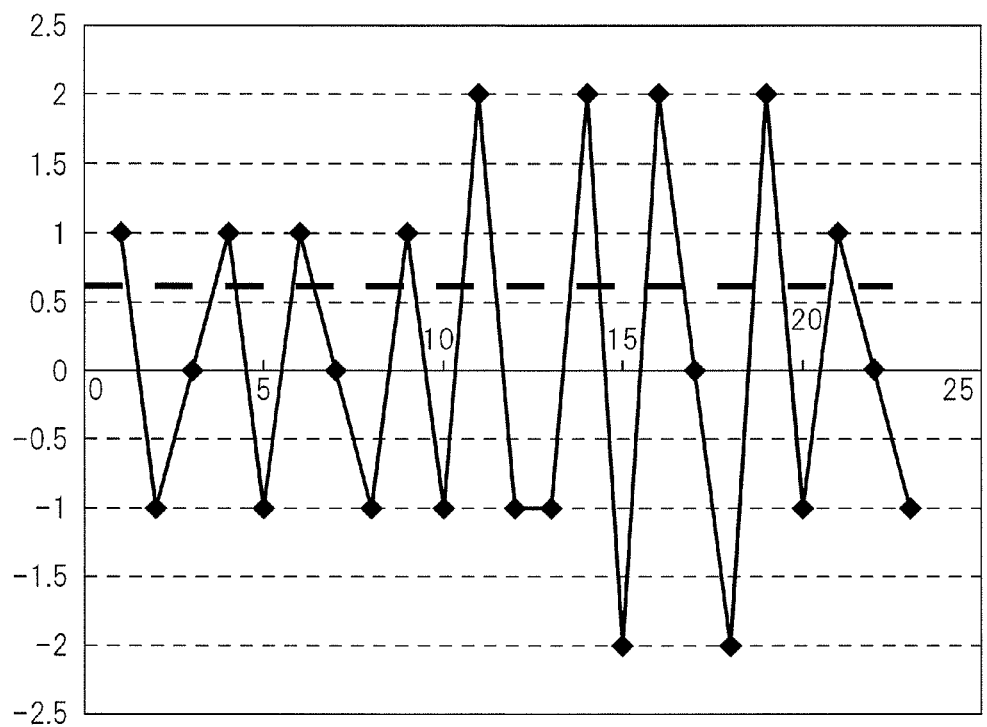
FIG. 5 is a diagram illustrating an output waveform when generating an analog output at a fixed DC level in the three-stage MASH sigma-delta modulator in FIG. 4.

The sigma-delta modulator of the first embodiment having the integration part 41 illustrated in FIG. 8 and the differentiation part 51 illustrated in FIG. 9 is compared with the general sigma-delta modulator illustrated in FIG. 4. The sigma-delta modulator illustrated in FIG. 4 takes in and processes one piece of input data in synchronization with one operation clock and outputs the calculation result in synchronization with one operation clock after a predetermined time elapses. Consequently, eight operation clocks are used to process eight pieces of input data. In contrast to this, the sigma-delta modulator of the first embodiment processes input data in parallel within one operation clock and outputs as 8-parallel data of SD [0 to 7].

Figure 10A:
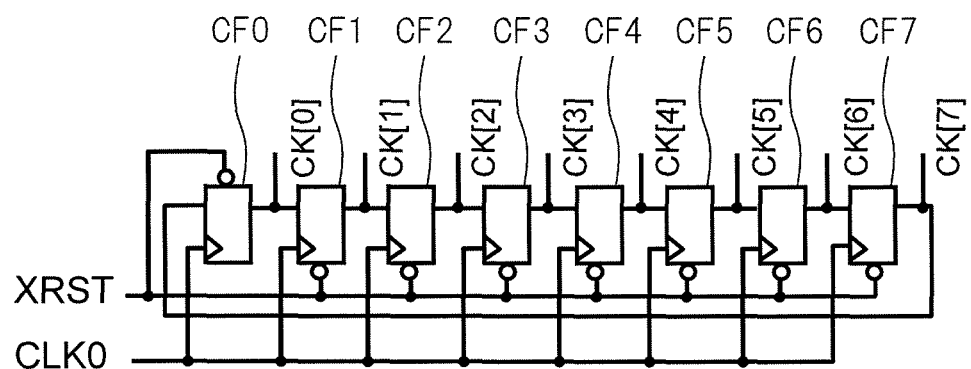
FIG. 10A is a circuit diagram of the 8-phase clock generation part 71.
Figure 10B:
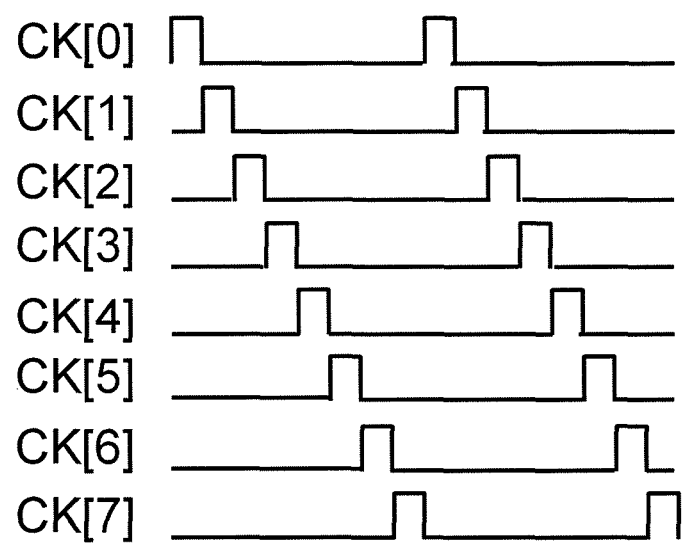
FIG. 10B is a time chart illustrating the operation of the 8-phase clock generation part.

FIG. 10A is the circuit diagram of the 8-phase clock generation part 71 and FIG. 10B is a time chart illustrating the operation of the 8-phase clock generation part 71.

As illustrated in FIG. 10A, the 8-phase clock generation part 71 is a circulation-type shift register in which eight flip-flops CF0 to CF7 are connected in series in such a manner that the output of the previous stage is the input to the subsequent stage and the output of the final stage is returned to the input of the initial stage. An inverted reset signal XRST is supplied to the set terminal of the flip-flop CF0 in the first stage and to the reset terminals of the other flip-flops CF1 to CF7.

As illustrated in FIG. 10B, by the inverted reset signal XRST, an output CK [0] of CF0 turns to H and outputs CK [1] to CK [7] of CF1 to CF7 turn to L. In this state, the inputs of CF0 and CF2 to CF7 are at L and the input of CF1 is at H, and therefore, if the master clock CLK0 is input, CK [1] turns to H and CK [0] and CK [2] to CK [7] turn to L. After this, in each period of CLK0, the position where CK turns to L shifts and circulates, and therefore, an 8-phase shift clock having a width of the period of CLK0 as illustrated in FIG. 10B is obtained. The 8-phase shift clock is supplied to the parallel-to-serial conversion part 61.

Figure 11:
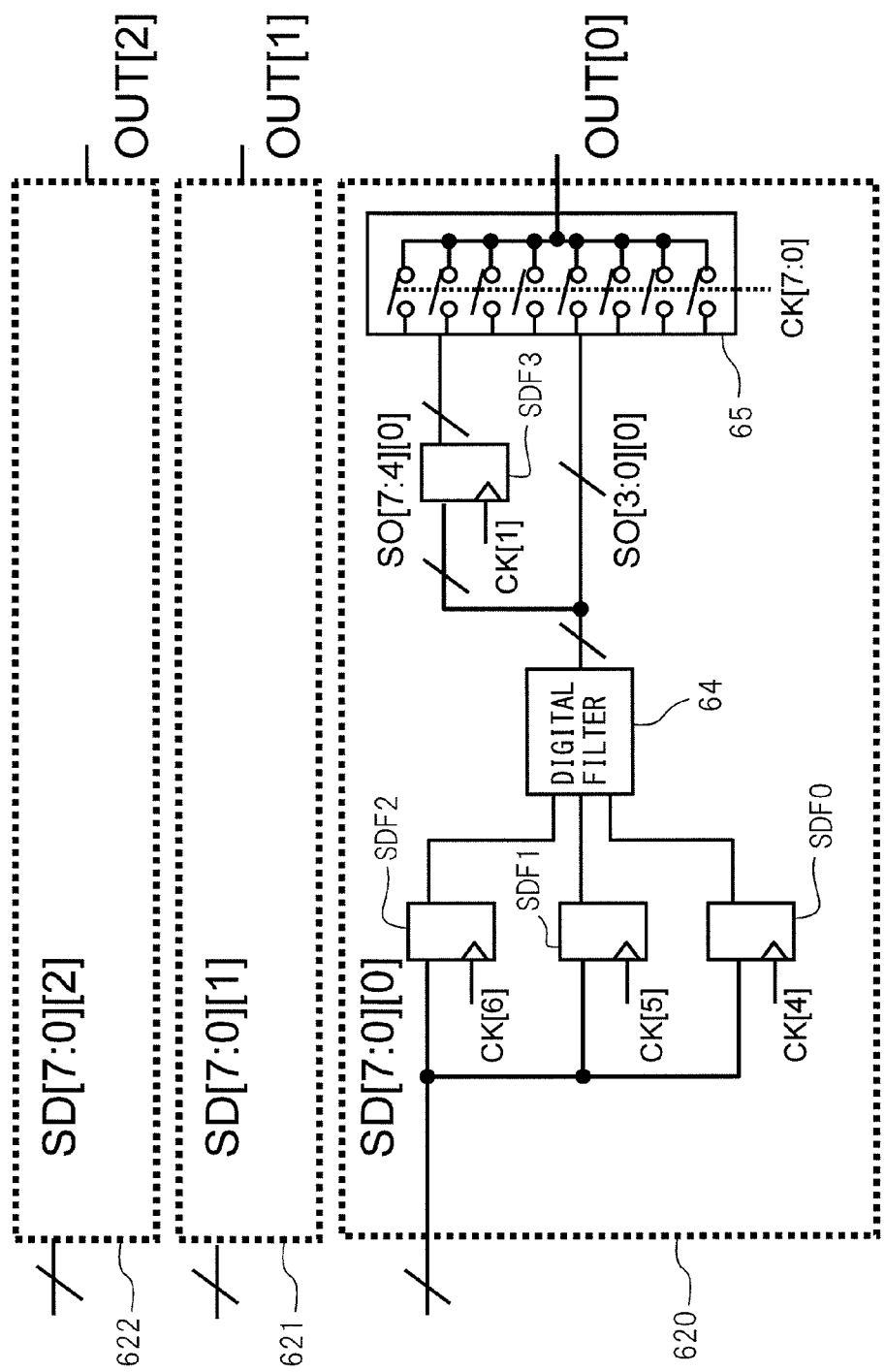
FIG. 11 is a diagram illustrating the configuration of the parallel-to-serial conversion part.
Figure 12:
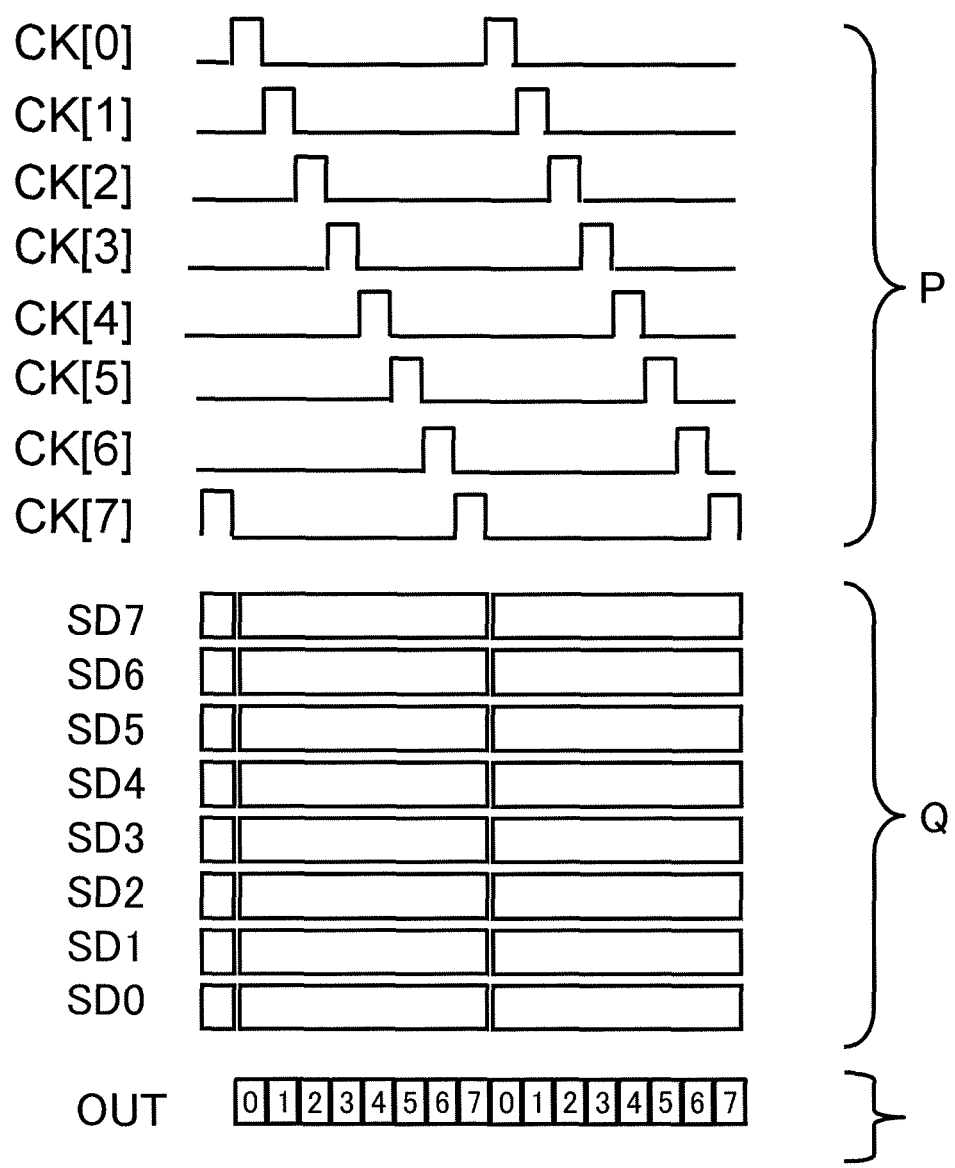
FIG. 12 is a time chart illustrating the operation of the parallel-to-serial conversion part.

FIG. 11 is a diagram illustrating the configuration of the parallel-to-serial conversion part 61. FIG. 12 is a time chart illustrating the operation of the parallel-to-serial conversion part 61.

As described above, the differentiation part 51 of the sigma-delta calculation part 31 outputs SD [0] to SD [7] in parallel, which is 3-bit data. The parallel-to-serial conversion part 61 has three conversion processing parts 620 to 622. The conversion processing part 620 converts a signal SD [7:0] [0] of the first bit of SD [0] to SD [7] into an 8-bit serial signal and outputs a converted output OUT [0]. The conversion processing part 621 converts a signal SD [7:0] [1] of the second bit of SD [0] to SD [7] into an 8-bit serial signal and outputs a converted output OUT [1]. The conversion processing part 622 converts a signal SD [7:0 ] [2] of the third bit of SD [0] to SD [7] into an 8-bit serial signal and outputs a converted output OUT [2]. OUT [0] to OUT [2] are 3-bit converted outputs and the parallel-to-serial conversion part 61 outputs OUT [0] to OUT [2] in synchronization with the master clock CLK0.

The conversion processing part 620 has three sets of latch groups SDF0 to SDF2, a digital filter 64, a latch group SDF3, and a selector 65. The latch groups SDF0 to SDF2 each have eight latches and the latch group SDF0 latches SD [7:0] [0] in accordance with CK [4], the latch group SDF1 latches SD [7:0] [0] in accordance with CK [5], and the latch group SDF2 latches SD [7:0] [0] in accordance with CK [6]. The latch group SDF3 latches SD [7:4] [0] corresponding to four bits of SD [7:0] [0] having passed through the digital filter in accordance with CK [1]. The digital filter 64 performs filter processing, to be described later, and outputs an output SO [7:0] [0]. The selector 65 sequentially selects and outputs SO [3:0] [0] and SO [7:4] [0] output from the latch group SDF3 in accordance with the 8-phase clock of CK [7:0].

The conversion processing parts 621 and 622 have the same configuration as that of the conversion processing part 620.

It is not guaranteed that the clock timing of the integration part 41 and the differentiation part 51 that operate at a low speed based on the operation clock CLKi agrees with the clock timing of the parallel-to-serial conversion part 61 that operates at a high speed based on the master clock CLK0. Because of this, to the parallel-to-serial conversion part 61 to which data from the differentiation part 51 is input, data for which agreement of timing is not guaranteed and in substantially the asynchronous state is input as a result.

Consequently, the conversion processing part 620 first performs clock transfer by a clock transfer mechanism. The clock transfer mechanism is formed by the three sets of the latch groups SDF0 to SDF2 and the digital filter. The 8-phase clocks CK [0] to CK [7] generated in the 8-phase clock generation part 71 are shifted as indicated by P in FIG. 12. With the three clocks CK [4] to CK [6], which are the fourth to sixth clocks, of the clocks CK [0] to CK [7], the latch groups SDF0 to SDF2 latch the data SD [7:0] [0] from the differentiation part 51. At this time, if the change edge of the data from the differentiation part 51 and the clock edge of latch agree, there is a possibility that an unstable (metastable) operation of latch is caused. Because of this, in order to remove this, processing is performed in the digital filter 64 after latch. As a simple example of processing in the digital filter 64, it may also be possible to use majority vote processing to take a majority vote of the three latch outputs and to use a majority vote circuit as the digital filter 64. After that, data of SO [7:4] [0] of the output SO [7:0 ] [0] of the digital filter 64 is further latched by the latch group SDF 3 with CK [1]. In the subsequent selection processing, processing is performed so that the transition timing of the select control signal CK [7:0] does not agree with the transition timing of the input signal of the selector 65.

By the above processing, as indicated by Q in FIG. 12, SD [0] to SD [7] are held during the rise of the pulses of CK [0] to CK [7] and the output OUT [0] to OUT [7] are output sequentially in accordance with CK [0] to CK [7].

Figure 13:
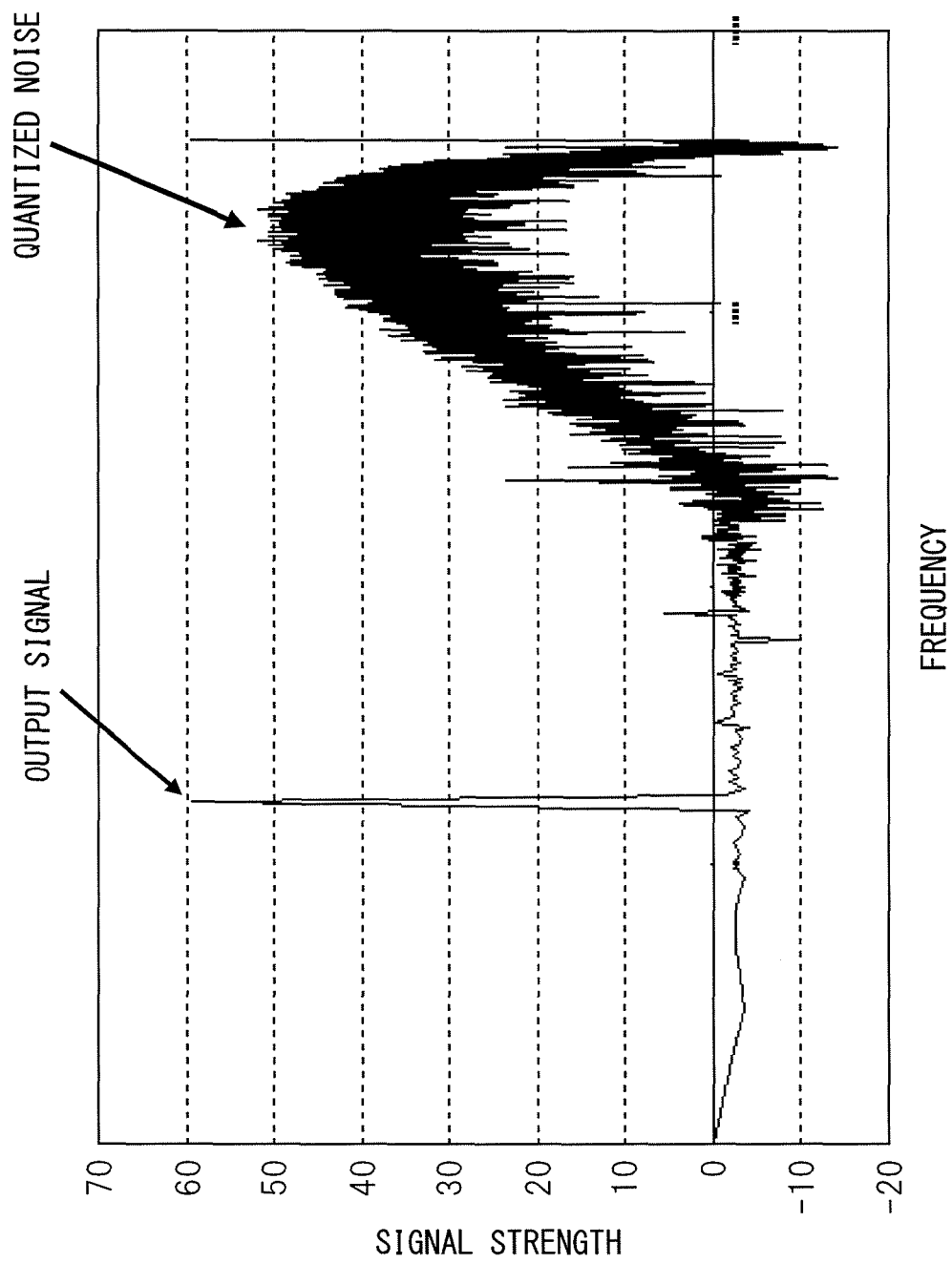
FIG. 13 is a diagram illustrating an output spectrum of the sigma-delta modulator of the first embodiment.

FIG. 13 is a diagram illustrating an output spectrum of the sigma-delta modulator of the first embodiment. As illustrated in FIG. 13, it is known that the calculation equivalent to that of the general sigma-delta modulator illustrated in FIG. 4 is performed in the first embodiment.

Figure 14:
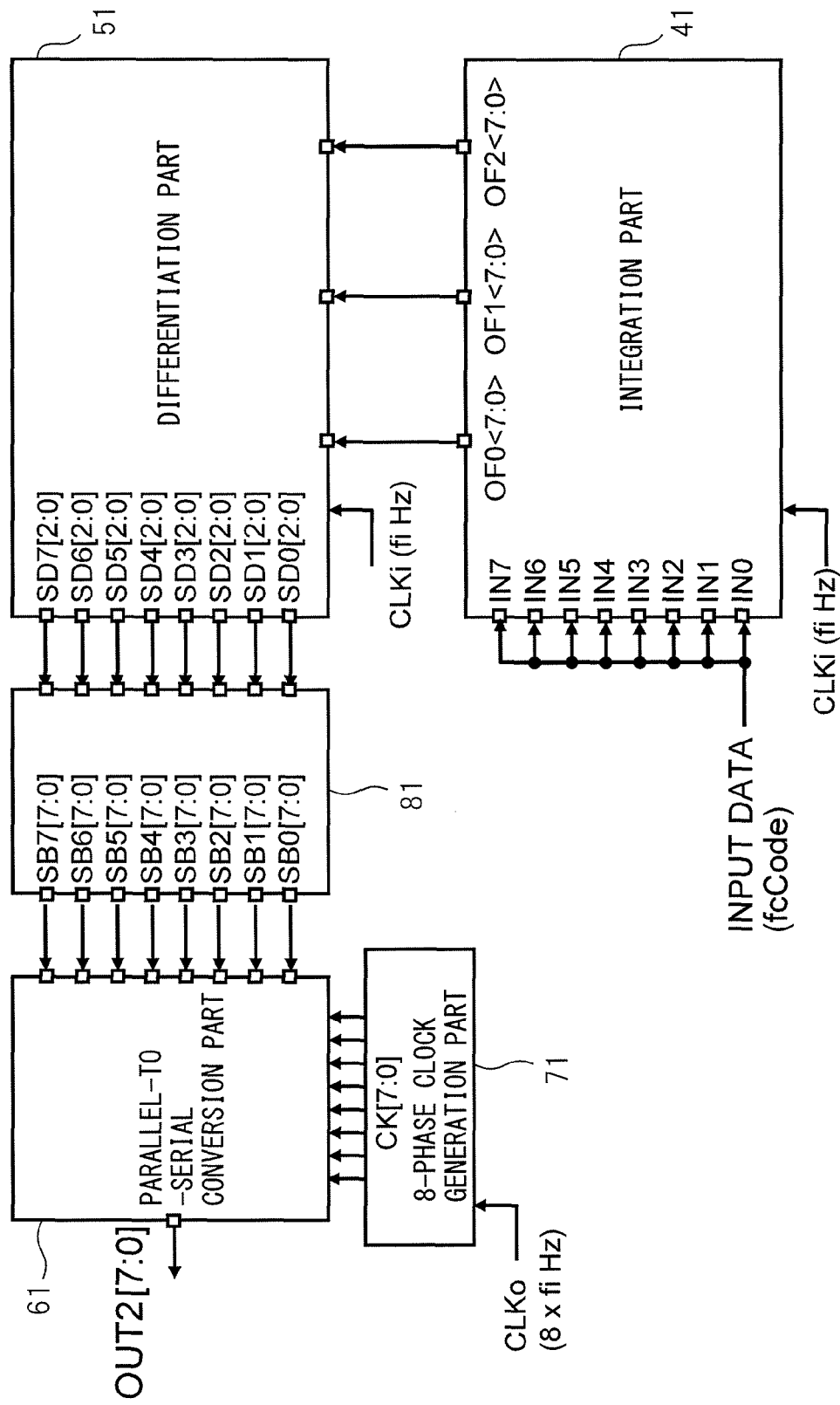
FIG. 14 is a diagram illustrating a general configuration of a sigma-delta modulator of a second embodiment.

FIG. 14 is a diagram illustrating a general configuration of a sigma-delta modulator of a second embodiment.

The sigma-delta modulator of the second embodiment differs from that of the first embodiment in that a code converter 81 is arranged after the differentiation part 51, which is configured to convert an output SD [7:0] [2:0] of the differentiation part 51 into an arbitrary code and then to input it to the parallel-to-serial conversion part 61 and others are the same.

FIG. 15 is a table indicating an example of conversion code. In this example, conversion to change the number of "1"s is performed for eight values of three bits from −3 to 4. In the 8-bit data after the conversion, "0" appears successively in the higher position(s) and "1" in the lower position(s) and the position where "0" turns to "1" shifts sequentially.

Figure 16:
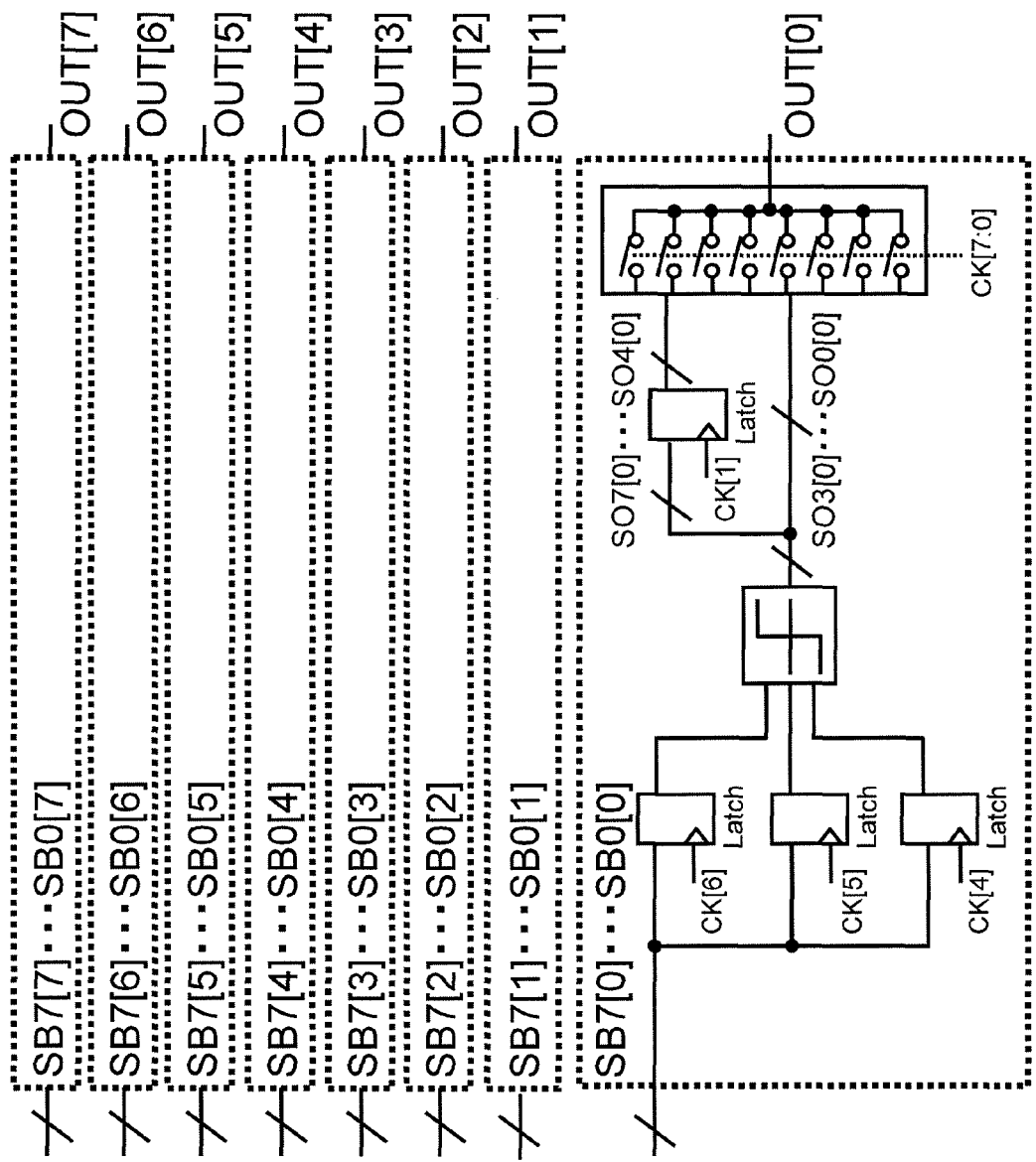
FIG. 16 is a diagram illustrating the configuration of the parallel-to-serial conversion part in the sigma-delta modulator of the second embodiment.

FIG. 16 is a diagram illustrating the configuration of the parallel-to-serial conversion part 61 in the sigma-delta modulator of the second embodiment. The data SD [0] to SD [7] input to the parallel-to-serial conversion part 61 are each 8-bit data, and therefore, eight conversion processing parts are provided. Each conversion processing part has the same configuration as that of the conversion processing part 620 in FIG. 11.

Figure 17:
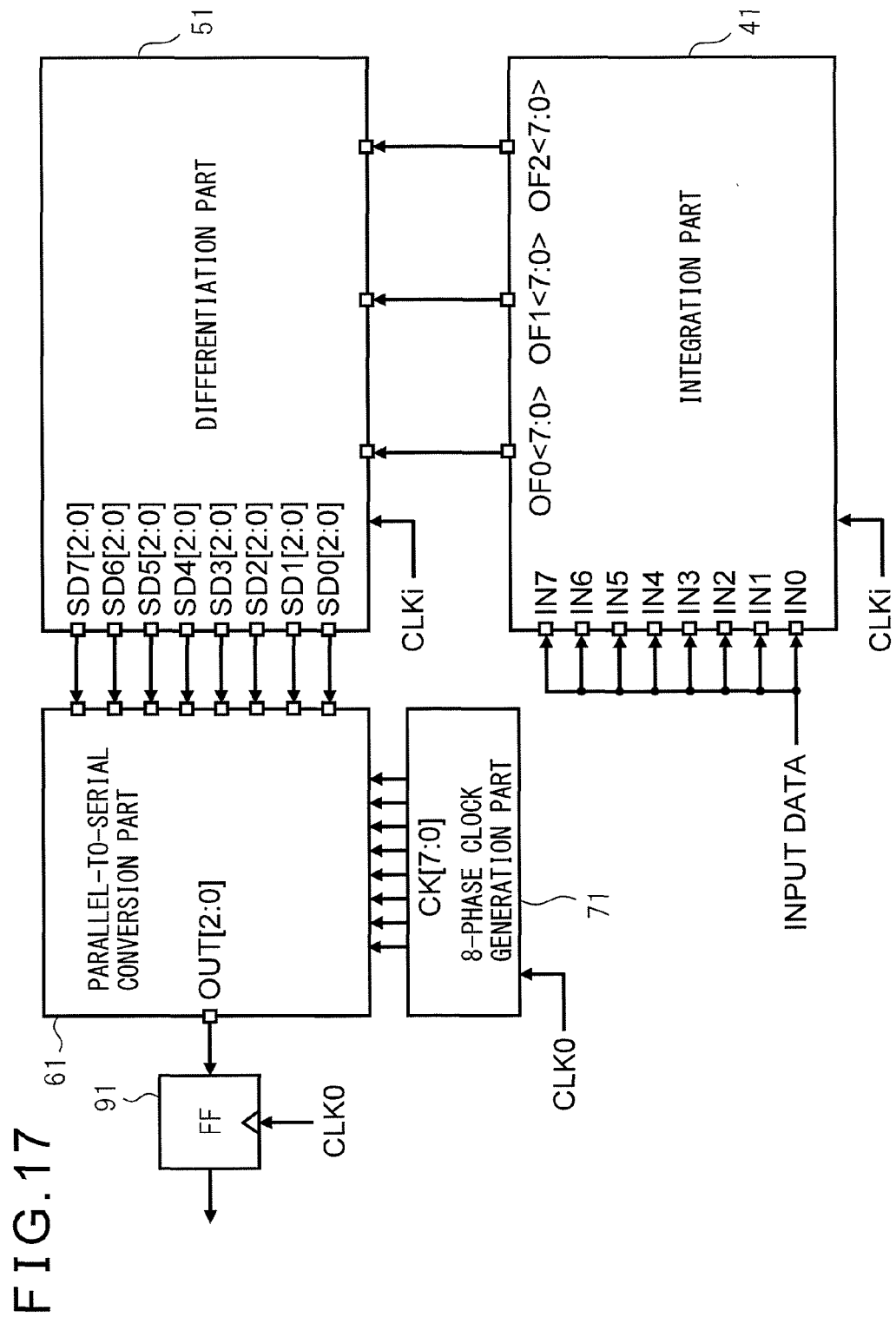
FIG. 17 is a diagram illustrating a general configuration of a sigma-delta modulator of a third embodiment.

FIG. 17 is a diagram illustrating a general configuration of a sigma-delta modulator of a third embodiment.

The sigma-delta modulator of the third embodiment differs from that of the first embodiment in that a flip-flop 91 is arranged after the parallel-to-serial conversion part 61, which is configured to readjust the timing with the master clock CLK0 and others are the same. In the first and the second embodiment, if the phase of the 8-phase clock of the 8-phase clock generation part 71 deviates, the deviation appears in the timing of the output data. In contrast to this, in the third embodiment, it is possible to eliminate the deviation and to set the timing of the output data with higher precision.

As above, the first to third embodiments are explained, however, it is needless to say that there can be various modification examples. For example, in the above-described embodiments, the example is explained in which eight pieces of data are processed in parallel in the three-stage MASH sigma-delta modulator, however, it may be understood by a person in the art that other values can be used for the number of stages of the MASH sigma-delta modulator and for the number of pieces of data to be processed in parallel.

As described above, according to the embodiments, the quantized noise is made more distant from the effective spectrum range in the vicinity of the DC by substantially increasing the operation clock by performing calculations in parallel at the integration part and the differentiation part of the MASH sigma-delta modulator. Due to this, the burden to the analog circuit is reduced and the chip area is then reduced.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A MASH sigma-delta modulator comprising:
an integration part having parallel integration units in M (M; an integer not less than 1) stages configured to receive N (N; an integer not less than 2) pieces of data from a previous stage, to perform integral calculation in parallel, and to output a result to a subsequent stage;
a differentiation part having parallel differentiation units each configured to calculate a difference between neighboring overflows of the corresponding parallel integration unit of the integration part and also to receive the difference, to perform differential calculation in parallel, and to output a result to a subsequent stage; and
a parallel-to-serial conversion part configured to parallel-to-serial convert outputs from the differentiation part, wherein
the parallel integration units in the initial stage of the integration part receive pieces of input data in parallel,
the parallel integration unit in each stage of the integration part and the parallel differentiation unit in each stage of the differentiation part perform integral calculation and differential calculation in each stage in one operation clock of a frequency 1/N times a master clock frequency, and
the parallel-to-serial conversion part outputs the result of the parallel-to-serial conversion in synchronization with the master clock.
2. The MASH sigma-delta modulator according to claim 1, further comprising a data conversion part configured to convert the outputs of the differentiation part into another pieces of data, wherein the parallel-to-serial conversion part parallel-to-serial converts the outputs from the data conversion part.

3. The MASH sigma-delta modulator according to claim 1, further comprising a data hold part configured to hold the result of the parallel-to-serial conversion output from the parallel-to-serial conversion part.

4. The MASH sigma-delta modulator according to claim 1, wherein
the parallel integration unit includes (N−1) input adders and N unit integrators,
the Xth (X is 2 to N) input adder calculates the total sum from the first input to the Xth input,
each of the unit integrators includes a data adder and a data hold unit,
the data adder of the first unit integrator adds the first input and data held in the Nth unit integrator, the second and subsequent data adders add the output of the corresponding input adder and data held in the Nth unit integrator, and the data hold unit holds the output of the corresponding data adder and outputs it in synchronization with the operation clock, and
overflows of the N data adders of the N unit integrators in each stage are output to the corresponding parallel differentiation unit.

5. The MASH sigma-delta modulator according to claim 4, wherein
the data hold units of the unit integrators other than the Nth unit integrator are removed in the parallel integration unit in the Mth stage.

6. The MASH sigma-delta modulator according to claim 4, wherein
the parallel differentiation unit in the Mth stage corresponding to the parallel integration unit in the Mth stage includes (N−1) input subtractors configured to calculate differences between neighboring overflows of the N data adders in the Mth stage, a flip-flop group M configured to hold the output of the (N−1)th input subtractor with the timing of the operation clock, a unit differentiator configured to perform subtraction between the overflow of the first data adder of the parallel integration unit in the Mth stage and the value held in the flip-flop group M, and (N−1) unit differentiators configured to calculate differences between neighboring outputs of the (N−1) input subtractors,
the parallel differentiation units in the stages other than the first stage and the Mth stage include (N−1) input subtractors configured to calculate differences between neighboring overflows of the N data adders in the stages corresponding to the (M−1)th stage to the second stage, a delay part configured to delay the overflows of the first data adders in the stages corresponding to the (M−1)th stage to the second state and the outputs of the (N−1) input subtractors by an amount corresponding to the number of clocks in accordance with the stage, N adders configured to add the outputs of the N unit differentiators in the previous stage and the outputs of the delay part, respectively, a flip-flop group M−1 configured to hold the output of the Nth adder with the timing of the operation clock, a unit differentiator configured to calculate a difference between the data of the flip-flop group M−1 and the output of the first adder, and (N−1) unit differentiators configured to calculate N differences between neighboring outputs of the N adders, and
the parallel differentiation unit in the first stage includes (N−1) input subtractors configured to calculate differences between neighboring overflows of the N data adders in the first stage, a delay part configured to delay the overflow of the first data adder in the first stage and the outputs of the (N−1) input subtractors by an amount corresponding to (M−1) clocks, and N adders configured to add the outputs of the N unit differentiators in the previous stage and the outputs of the delay part, respectively.

7. The MASH sigma-delta modulator according to claim 1, wherein
the parallel-to-serial conversion part has circulation type shift registers in N stages and generates N-phase latch clock group having a period N times the period of the master clock.

8. The MASH sigma-delta modulator according to claim 7, wherein
the circulation type shift registers in the N stages have N flip-flops connected in series, in which circulation is achieved by connecting the flip-flop output in the final stage to the flip-flop input in the initial stage and a reset signal is input to the reset terminals of the (N−1) flip-flops and to the set terminal of the remaining one flip-flop.

9. The MASH sigma-delta modulator according to claim 7, wherein
the parallel-to-serial conversion part receives N pieces of parallel data output from the differentiation part in parallel, and
the parallel-to-serial conversion part includes:
clock transfer equipment having a plurality of latch groups configured to latch the N pieces of parallel data with a multi-phase latch clock of the latch clock group, and a digital filter configured to perform filter processing of the outputs of the plurality of latch groups;
a second latch group configured to latch L (L is a positive integer smaller than N) pieces of data of the outputs of the digital filter with the latch clock in one of the phases of the latch clock groups, and
a selector configured to receive the L pieces of data latched by the second latch group and the remaining (N−L) pieces of data as inputs, and to take the latch clock of the latch clock group as a control signal.

10. A D/A converter comprising:
an interpolation filter configured to generate oversampling data;
a sigma-delta modulator configured to convert the oversampling data with a large number of bits into converted data with a small number of bits;
a D/A converter for a small number of bits configured to convert the converted data with a small number of bits into an analog signal; and
an analog low-pass filter configured to allow low-frequency components of the output of the D/A converter with a small number of bits to pass, wherein
the sigma-delta modulator is a MASH sigma-delta modulator including:
an integration part having parallel integration units in M (M; an integer not less than 1) stages configured to receive N (N; an integer not less than 2) pieces of data from a previous stage, to perform integral calculation in parallel, and to output a result to a subsequent stage;
a differentiation part having parallel differentiation units each configured to calculate a difference between neighboring overflows of the corresponding parallel integration unit of the integration part and also to receive the difference, to perform differential calculation in parallel, and to output a result to a subsequent stage; and a parallel-to-serial conversion part configured to parallel-to-serial convert outputs from the differentiation part, wherein the parallel integration units in the initial stage of the integration part receive pieces of input data in parallel, the parallel integration unit in each stage of the integration part and the parallel differentiation unit in each stage of the differentiation part perform integral calculation and differential calculation in each stage in one operation clock of a frequency 1/N times a master clock frequency, and the parallel-to-serial conversion part outputs the result of the parallel-to-serial conversion in synchronization with the master clock.

11. The D/A converter according to claim 10, wherein the MASH sigma-delta modulator further includes a data conversion part configured to convert the outputs of the differentiation part into another piece of data, wherein the parallel-to-serial conversion part parallel-to-serial converts the outputs from the data conversion part.

12. The D/A converter according to claim 10, wherein the MASH sigma-delta modulator includes a data hold part configured to hold the result of the parallel-to-serial conversion output from the parallel-to-serial conversion part.

13. The D/A converter according to claim 10, wherein the parallel integration unit includes (N−1) input adders and N unit integrators, the Xth (X is 2 to N) input adder calculates the total sum from the first input to the Xth input, each of the unit integrators includes a data adder and a data hold unit, the data adder of the first unit integrator adds the first input and data held in the Nth unit integrator, the second and subsequent data adders add the output of the corresponding input adder and data held in the Nth unit integrator, and the data hold unit holds the output of the corresponding data adder and outputs it in synchronization with the operation clock, and overflows of the N data adders of the N unit integrators in each stage are output to the corresponding parallel differentiation unit.

14. The D/A converter according to claim 13, wherein the data hold units of the unit integrators other than the Nth unit integrator are removed in the parallel integration unit in the Mth stage.

15. The D/A converter according to claim 13, wherein the parallel differentiation unit in the Mth stage corresponding to the parallel integration unit in the Mth stage includes (N−1) input subtractors configured to calculate differences between neighboring overflows of the N data adders in the Mth stage, a flip-flop group M configured to hold the output of the (N−1)th input subtractor with the timing of the operation clock, a unit differentiator configured to perform subtraction between the overflow of the first data adder of the parallel integration unit in the Mth stage and the value held in the flip-flop group M, and (N−1) unit differentiators configured to calculate differences between neighboring outputs of the (N−1) input subtractors, the parallel differentiation units in the stages other than the first stage and the Mth stage include (N−1) input subtractors configured to calculate differences between neighboring overflows of the N data adders in the stages corresponding to the (M−1)th stage to the second stage, a delay part configured to delay the overflows of the first data adders in the stages corresponding to the (M−1)th stage to the second state and the outputs of the (N−1) input subtractors by an amount corresponding to the number of clocks in accordance with the stage, N adders configured to add the outputs of the N unit differentiators in the previous stage and the outputs of the delay part, respectively, a flip-flop group M−1 configured to hold the output of the Nth adder with the timing of the operation clock, a unit differentiator configured to calculate a difference between the data of the flip-flop group M−1 and the output of the first adder, and (N−1) unit differentiators configured to calculate N differences between neighboring outputs of the N adders, and the parallel differentiation unit in the first stage includes (N−1) input subtractors configured to calculate differences between neighboring overflows of the N data adders in the first stage, a delay part configured to delay the overflow of the first data adder in the first stage and the outputs of the (N−1) input subtractors by an amount corresponding to (M−1) clocks, and N adders configured to add the outputs of the N unit differentiators in the previous stage and the outputs of the delay part, respectively.

16. The D/A converter according to claim 10, wherein the parallel-to-serial conversion part has circulation type shift registers in N stages and generates N-phase latch clock group having a period N times the period of the master clock.

17. The D/A converter according to claim 16, wherein the circulation type shift registers in the N stages have N flip-flops connected in series, in which circulation is achieved by connecting the flip-flop output in the final stage to the flip-flop input in the initial stage and a reset signal is input to the reset terminals of the (N−1) flip-flops and to the set terminal of the remaining one flip-flop.

18. The D/A converter according to claim 16, wherein the parallel-to-serial conversion part receives N pieces of parallel data output from the differentiation part in parallel, and the parallel-to-serial conversion part includes:

clock transfer equipment having a plurality of latch groups configured to latch the N pieces of parallel data with a multi-phase latch clock of the latch clock group, and a digital filter configured to perform filter processing of the outputs of the plurality of latch groups;

a second latch group configured to latch L (L is a positive integer smaller than N) pieces of data of the outputs of the digital filter with the latch clock in one of the phases of the latch clock groups, and a selector configured to receive the L pieces of data latched by the second latch group and the remaining (N−L) pieces of data as inputs, and to take the latch clock of the latch clock group as a control signal.

\* \* \* \* \*